United States Patent
Cao

(10) Patent No.: US 6,542,043 B1
(45) Date of Patent: Apr. 1, 2003

(54) ALL PMOS FULLY DIFFERENTIAL VOLTAGE CONTROLLED OSCILLATOR

(75) Inventor: Jun Cao, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 09/978,347

(22) Filed: Oct. 16, 2001

(51) Int. Cl.[7] .......................... H03B 5/12; H03L 7/099; H03L 7/085
(52) U.S. Cl. ..................... 331/117 FE; 331/17; 331/25; 331/36 C; 331/117 R; 331/175; 331/177 V; 375/376; 455/260
(58) Field of Search .................. 331/8, 17, 18, 331/25, 36 C, 117 R, 117 FE, 117 D, 175, 177 V; 327/156–159; 332/127; 360/51; 375/376; 455/260

(56) References Cited

U.S. PATENT DOCUMENTS 6,219,397 B1 * 4/2001 Park ........................... 375/376

* cited by examiner

Primary Examiner—David C. Mis
(74) Attorney, Agent, or Firm—Garlick Harrison & Markison, L.L.P.; Shayne X. Short

(57) ABSTRACT

All PMOS (p channel metal oxide semiconductor) fully differential voltage controlled oscillator (VCO). A fully differential implementation within the present invention provides for a very effective rejection of common mode noises. In addition, the PMOS implementation of the present invention allows for a substantial reduction in 1/f noise. The PMOS fully differential VCO may be employed within phase locked loops (PLLs) and other applications that require a very clean signal (with very low noise) and that must be operable at very high frequencies. The present invention enables a very compact design, thereby minimizing extraneous noise pickup. The device may be over-driven with a higher power supply than is commonly used in prior art VCOs; the over-driving provides for a higher transconductance $g_m$ from the PMOS device enabling higher gain. A center-tapped inductor is shunted to ground in a manner that does not reduce the inductor's quality factor Q.

30 Claims, 9 Drawing Sheets

ALL PMOS FULLY DIFFERENTIAL VOLTAGE CONTROLLED OSCILLATOR

BACKGROUND

1. Technical Field

The invention relates generally to integrated circuitry; and, more particularly, it relates to systems and methods that employ fully differential voltage controlled oscillators.

2. Related Art

Prior art voltage controlled oscillators (VCOs) are commonly implemented using NMOS (n channel metal oxide semiconductor) transistors or a combination of NMOS and PMOS (p channel metal oxide semiconductor) transistors. In many integrated circuit applications, a VCO is one of the main high-speed components in a device. As a result, the noise generated by the VCO is a major factor that determines the overall performance of the device. In addition, the noise immunity of a VCO against the noise from a power supply and the substrate may have a very large impact on the robustness of the device when operating in a noisy environment.

For example, the VCO is a common building block in phase locked loops (PLLs); the VCO is used to provide a very clean local frequency reference. In such application, the PLL often needs to be very well shielded from noise sources. The noise pickup of a VCO scales with its size; the larger the size of the VCO, then the more antenna-like the circuit will act in terms of noise pick up. In addition, VCO applications commonly operate at very high frequencies. These two competing needs of a VCO (to operate at very high operating frequencies and to generate relatively low noise) are intimately coupled in design efforts to achieve a high performance PLL.

Further limitations and disadvantages of conventional and traditional systems will become apparent to one of skill in the art through comparison of such systems with the invention as set forth in the remainder of the present application with reference to the drawings.

SUMMARY OF THE INVENTION

Various aspects of the invention can be found in an all PMOS (p channel metal oxide semiconductor) fully differential voltage controlled oscillator (VCO). The differential implementation of the PMOS VCO enables the rejection and elimination of a large degree of noise—especially common mode noise. All of the active devices may be implemented in an NWELL that is isolated from the remainder of the substrate. Therefore, the VCO will effectively see less substrate noise and will be less susceptible to substrate coupling. PMOS transistors typically have mush less 1/f noise compared to NMOS transistors. The 1/f noise is undesirable because it can be up-converted to the operating frequency of the device and thereby degrade the noise performance of a VCO. The present invention is operable using only PMOS transistors and thus eliminates one of the most dominant noise sources of the VCO.

In addition, the present invention obviates the need for a deep NWELL that is commonly required for VCO designs that use a combination of NMOS and PMOS transistors to reduce substrate coupling. Implementing a deep NWELL requires proper biasing and a need for separation from other circuits by a certain distance. The present invention does not require the deep NWELL associated in NMOS implementations, and it thereby simplifies the design layout and thus allows for a more compact design. This improved compacted-ness provides for less parasitic capacitance from interconnects. This makes it much easier to have the VCO frequency to be closer to that of the actual silicon. In addition, less parasitic capacitance means that a VCO designed in accordance with the present invention provides for a greater tuning range when compared to prior art VCOs. Because the physical layout of the VCO can be smaller, it is also less susceptible to the noise coupled from substrate.

The present invention also employs a center-tapped inductor and differential tuned varactor. The center-tapped inductor is laid out directly on the substrate in certain embodiments. This fully differential implementation, offered by the present invention, fits well into the concept of a fully differential PLL design. The center tap of the center-tapped inductor (the AC ground) is shunted to the device's DC ground. A resistor is employed in certain embodiments. In doing this, the VCO is enabled to function with a power supply higher than the maximum voltage drop that a device can sustain as determined by the specific device's processing. The VCO can be effectively over-driven to provide for higher gains as desired. Additional components may be used in shunting the inductor's center tap to ground, including capacitors. By changing the value of the shunt to ground devices, the amplitude of the oscillation and the common mode of the output signal may be adjusted. Because the frequency of the VCO is not sensitive to the capacitance of the AC ground, a large capacitance may be connected from the center-tapped inductor's center tap to a clean power supply to filter noise from the substrate even further.

The above-referenced description of the summary of the invention describes some of the various aspects of the present invention. The claims are also directed to some other of the various other embodiments of the subject matter towards which the present invention is directed. In addition, other aspects, advantages and novel features of the invention will become apparent from the following detailed description of the invention when considered in conjunction with the accompanying drawings.

BRIEF DESCRIPTION OF THE DRAWINGS

A better understanding of the invention can be obtained when the following detailed description of various exemplary embodiments is considered in conjunction with the following drawings.

DETAILED DESCRIPTION OF THE INVENTION

Figure 1:
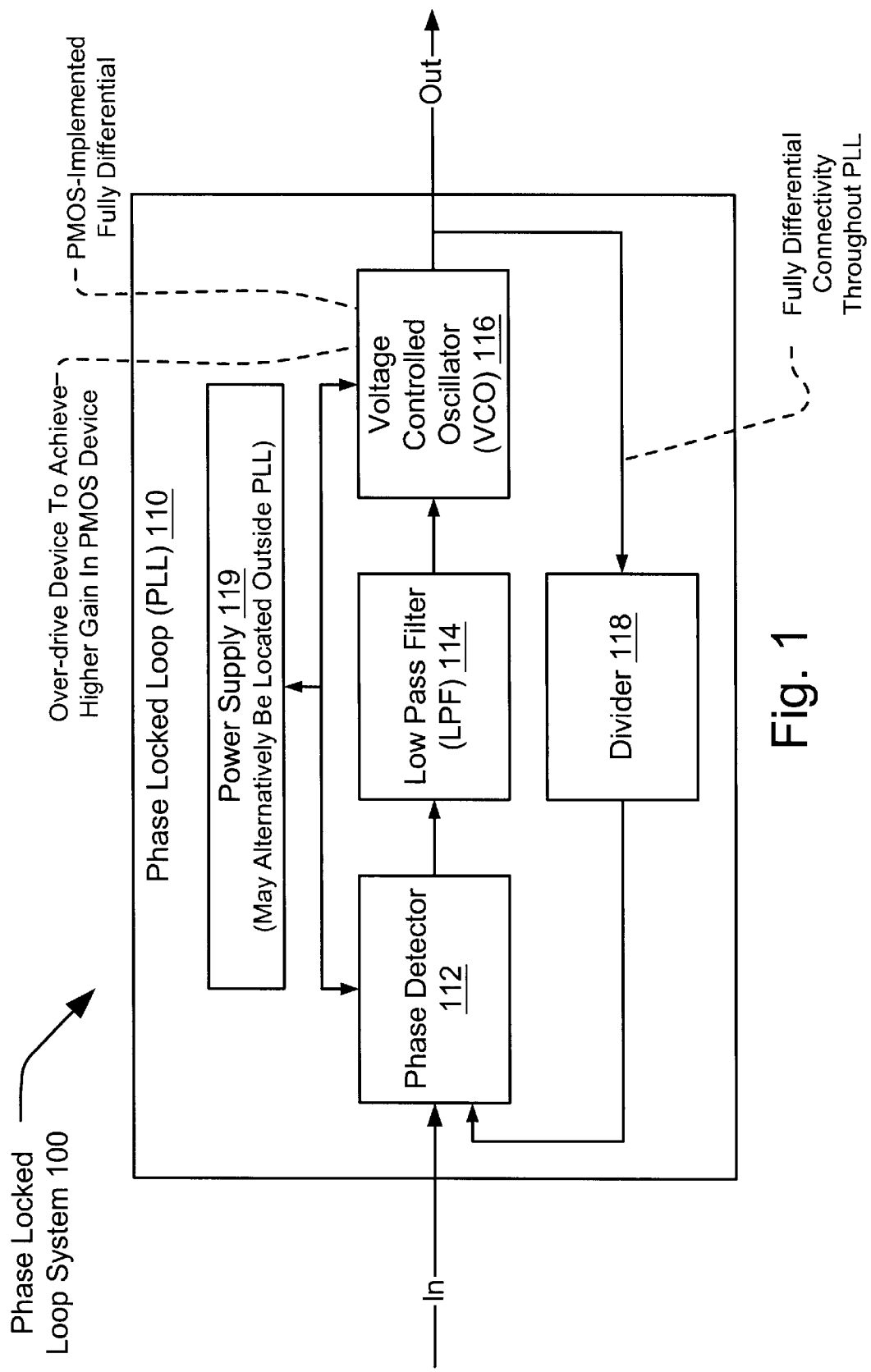
FIG. 1 is a system diagram illustrating an embodiment of a phase locked loop (PLL) system that is built in accordance with certain aspects of the present invention.

The convergence of various high-speed data communication technologies, including Ethernet, fiber channel, IEEE firewire links and others, into the Gbit domain has focused efforts of integrated circuit designers on developing high speed circuit techniques for processing broadband signals. Similarly, efforts have been directed at developing low cost and low power dissipation circuits have been driven by the explosive growth in wireless media for voice and data communications.

Certain aspects of the present invention provide for an improved voltage controlled oscillator (VCO) that is applicable in a variety of applications including voice and data communications. A phase locked loop (PLL) is one such typical application context for a VCO. One of the primary functions of a VCO is to provide a local time reference by outputting a signal with a very accurate frequency. The noise of the VCO was commonly one of dominant factors that governed the noise performance of an entire chip. The present invention provides for a significant reduction in noise while maintaining performance.

The present invention employs techniques that provide for a further boosting of transconductance ($g_m$) of the transistors in VCO and also pushes the cutoff frequency ($f_t$) to a higher end than experienced before. The present invention employs transistors with less intrinsic noise and also eliminates the NMOS (n channel metal oxide semiconductor) transistors in the VCO. In addition, the present invention may be implemented in a fully differential manner, thereby providing a superior immunity to common mode noise sources. A PMOS implemented fully differential VCO exhibits much better noise qualities and is very robust against common mode noises including those coupled from power supplies and those that are undesirably communicatively coupled across the substrate itself.

The present invention allows for the over-driving of the PMOS device to provide for sufficient gain at high frequency. In such embodiments, the VCO is over-driven with a higher voltage power supply than is commonly used in prior art VCOs. This over driving provides for the higher transconductance ($g_m$) and also provides for a larger positive feedback for the loop. The technology is not limited to PMOS VCOs; if desired, cross-coupled NMOS transistors may be employed in the circuit to enable oscillation and also to provide for even greater feedback loop gain.

In a prior art cross-coupled VCO, with both PMOS and NMOS devices, the NMOS devices conduct DC current from the PMOS to ground. However, in the improved PMOS VCO, one embodiment replaces the NMOS devices with devices, such as resistors, to conduct the current. The present invention is operable to employ a center-tapped inductor structure that is connected to ground through a resistor, thereby providing the DC current route. Using this novel approach, the inductor quality factor Q is not reduced because the resistor is connected to the AC ground of the oscillator circuit. In addition, the values of the shunted resistor can be adjusted to control the biasing of the transistor and thus the amplitude of oscillation.

FIG. 1 is a system diagram illustrating an embodiment of a phase locked loop (PLL) system 100 that is built in accordance with certain aspects of the present invention. The operation of a PLL is understood by those skilled in the art.

The PLL system 100 employs a phase locked loop (PLL) 110 that receives an input signal and locks onto it and provides an output signal that is in phase with the input signal. The PLL 110 includes a phase detector 112 for detecting the phase difference between the incoming signal to the PLL 110 and the local signal; a low pass filter (LPF) 114 (sometime referred to as a loop filter) limits the frequency spectrum over which the signal is employed, and a voltage controlled oscillator 116 generates a local signal of the incoming signal.

In general, a phase locked loop (PLL) is an electronic circuit that synchronizes the signal from an oscillator with a second input signal (called the "reference"), so that they operate at the same frequency. The loop synchronizes the VCO to the input reference by comparing their phases and controls the VCO in such a manner that a constant phase relationship is maintained between the two signals. If it is determined that the incoming signal and the local signal are in phase (the two clocks are in phase), then no phase adjustment need be performed. However, if the regenerated clock from VCO lags the reference signal, then the phase adjuster needs to compensate for this by advancing the regenerated clock. If it leads the reference signal, the phase adjuster needs to make the opposite change.

From certain perspectives, phase locked loop (PLL) circuits are implemented and used for frequency control. They may be configured as frequency multipliers, demodulators, tracking generators or clock recovery circuits. The PLL system 100 is basically a feedback control system that controls the phase of a voltage controlled oscillator (VCO) 116. The input signal to the PLL 110 is applied to one input of the phase detector 112. The other input is connected to the output of a divider 118 (that may be a divide by N counter) whose input is the output of the VCO 116. Normally the frequencies of both of these signals will be nearly the same. The output of the phase detector 112 is a voltage proportional to the phase difference between these two inputs. This signal is applied to a loop filter that is shown as being a low pass filter (LPF) 114 in this embodiment. It is the loop filter (LPF 114) that determines the dynamic characteristics of the PLL 110. The filtered signal controls the VCO 116. It is also noted that the output of the VCO 116 is at a frequency that is N times the signal supplied to the frequency reference input. This output signal is sent back to the phase detector 111 via the divider 118 (which may be a divide by N counter).

For additional understanding of the operation of the PLL 110, it is noted that the loop filter (shown here as the LPF 114) will be designed to match the characteristics required by the application of the PLL 110. For example, if the PLL 110 is to acquire and track a signal, then the bandwidth of the loop filter will be greater than if it expects a fixed input frequency. The frequency range over which the PLL 110 may lock onto is called the capture range. Once the PLL 110 is locked, the range of frequencies that the PLL 110 will follow is called the tracking range. Generally the tracking range is larger than the capture range. The loop filter also determines how fast the signal frequency can change and still maintain lock. This is the maximum slewing rate. The narrower the loop filter bandwidth (or the lower the frequency range of the LPF 114), then the smaller the achievable phase error. This comes at the expense of slower response and reduced capture range.

The PLL 110 includes a power supply 119 that energizes the phase detector 112 and the VCO 116. The power supply 119 may alternatively be located outside of the PLL 110 as well. The VCO 116 can be implemented by an all PMOS VCO. The VCO 116 may be over-driven to achieve a higher transconductance ($g_m$) thereby achieving higher gain than is commonly achievable in PMOS devices. The boosted transconductance ($g_m$) exceeds a rated transconductance ($g_m$) of the PMOS device, given that the current exceeds the typical rated current of the PMOS device.

Moreover, the connectivity within the PLL may be performed in a differential manner thereby substantially minimizing or effectively eliminating common mode noises. It is understood that the connectivity to the power supply 119 need not be differential. As described above, in many prior art systems, a VCO is a major noise contributor within a PLL system. The PLL system 100, by implementing a PMOS, fully differential VCO (the VCO 116), is able to employ a much more compact design that generates and picks up less noise. In addition, as will be seen below in other embodiments, the use of a PMOS VCO (the VCO 116) allows the whole circuit to be put into a single NWELL that also helps achieve more compacted-ness in design and also minimizes cross-coupling across the substrate.

Figure 2:
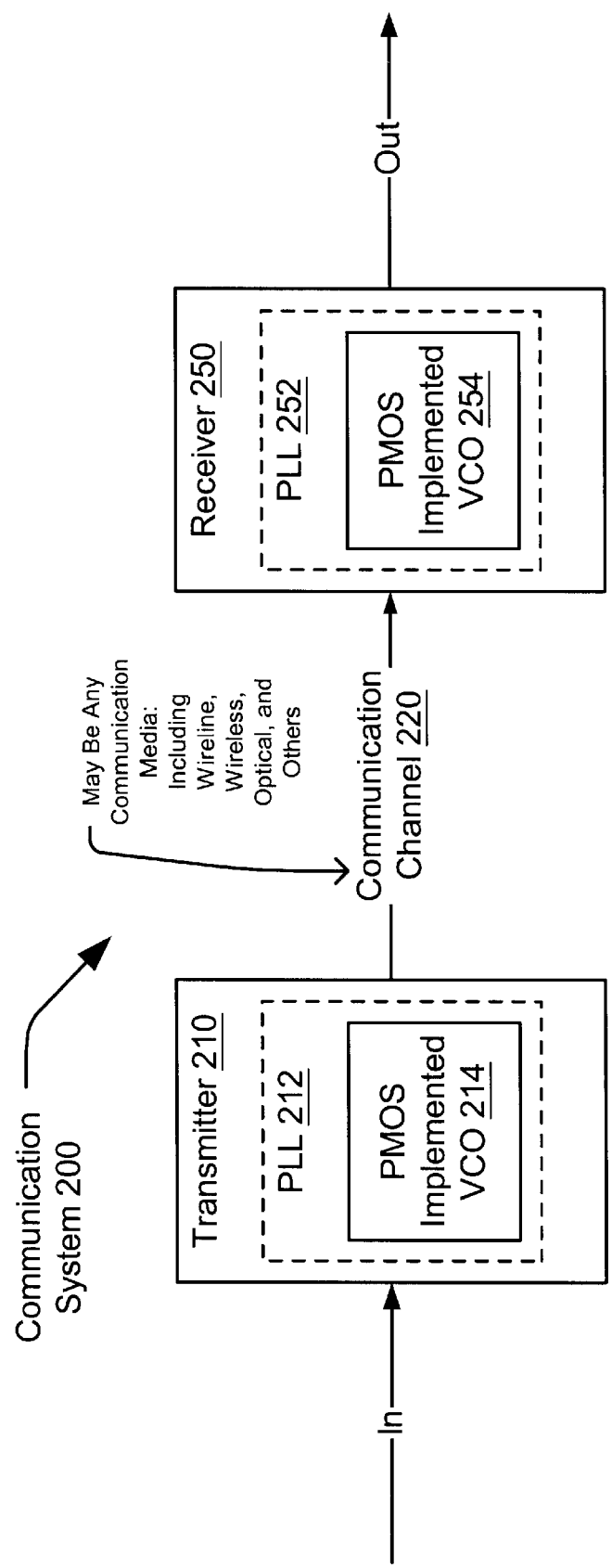
FIG. 2 is a system diagram illustrating an embodiment of a communication system that is built in accordance with certain aspects of the present invention.

FIG. 2 is a system diagram illustrating an embodiment of a communication system 200 that is built in accordance with certain aspects of the present invention. The communication system 200 includes a transmitter 210, a receiver 250, and the communication channel 220. The transmitter 210 may be viewed as an encoder from certain perspectives. The transmitter 210 includes a PMOS implemented VCO 214. The PMOS implemented VCO 214 is contained within a PLL 212 in certain embodiments. The transmitter 210 transmits data across a communication channel 220 to a receiver 250. The communication channel 220 may be any type of communication channel including wireline, wireless, optical and other types of communication media without departing from the scope and spirit of the invention. Similar to the transmitter 210, the receiver 250 includes a PMOS implemented VCO 254. In addition, the PMOS implemented VCO 254 is contained within a PLL 252 in certain embodiments. The FIG. 2 shows how a PMOS VCO may be implemented in either the transmitter 210 or the receiver 250 of the communication system 200.

Figure 3:
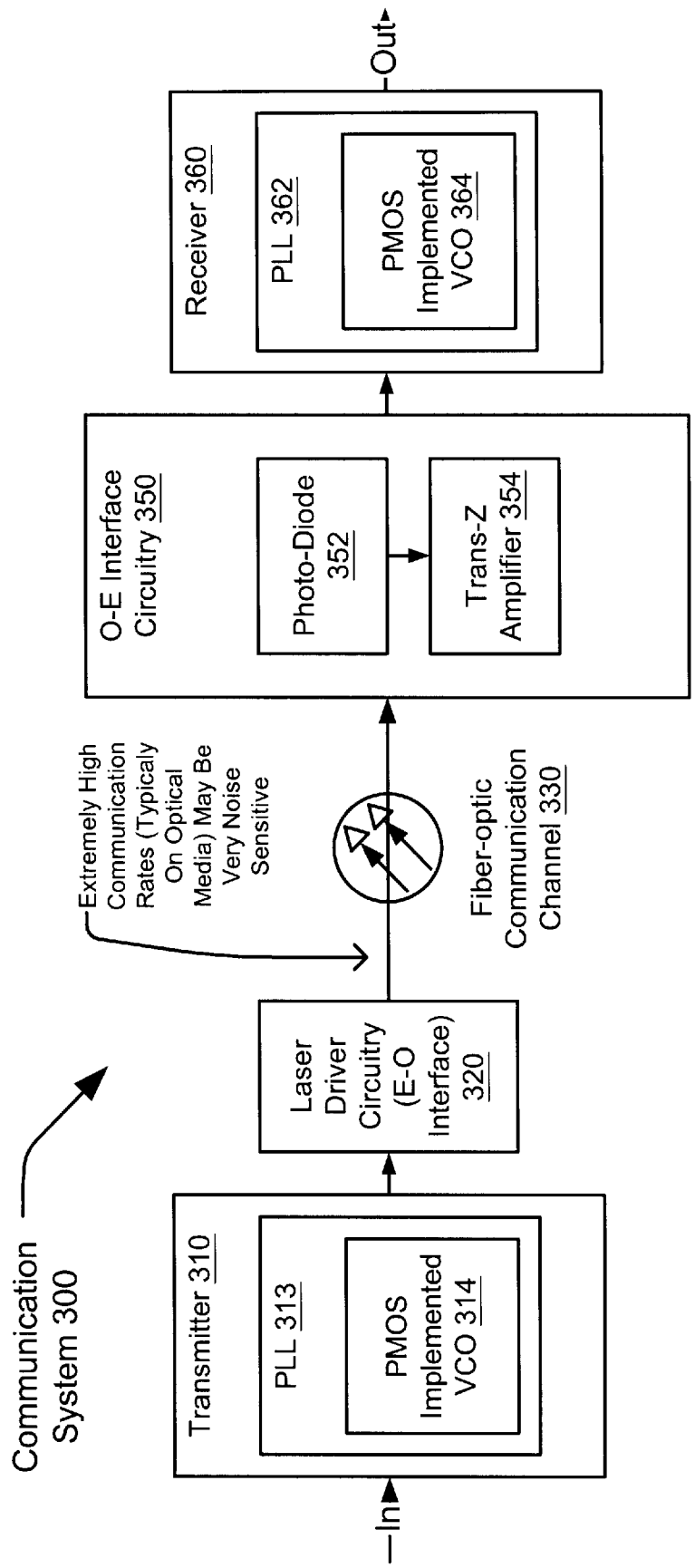
FIG. 3 is a system diagram illustrating another embodiment of a communication system that is built in accordance with certain aspects of the present invention.

FIG. 3 is a system diagram illustrating another embodiment of a communication system 300 that is built in accordance with certain aspects of the present invention. The communication system 300 includes a transmitter 310, an Electrical to Optical (E-O) interface 320 (laser driver circuitry), an Optical to Electrical (O-E) interface circuitry 350 (including both a photo diode (PD) 352 and a trans-impedance amplifier (TIA) 354), a receiver 360, and the communication channel 330. The transmitter 310 may be viewed as an encoder from certain perspectives. The transmitted 310 includes a PLL 313 that includes a PMOS implemented VCO 314.

The transmitter 310 transmits provides data to a laser driver circuitry 320. The laser driver circuitry 320 may be viewed as being an electrical to optical interface. In the particular communication system 300, that employs a fiber-optic communication channel. 330, the laser drive circuitry 320 may be viewed as the device that converts the electrical signal to an optical signal and puts the signal into the fiber-optic communication channel 330. The fiber-optic communication channel 330 typical will operate at very high (or extremely high) data rates; these types of channels may be very noise sensitive. Therefore, the transmitter 310 must be a very low noise device. It is understood that the laser driver circuitry 320 may alternatively very well be contained within the transmitter 310 without departing from the scope and spirit of the invention.

At the other end of the fiber-optic communication channel 330, the photo diode (PD) 352 and the trans-impedance amplifier (TIA) 354 receives the optical signal. From certain perspectives, the PD 352 and the TIA 354 may be viewed as the elements that cooperatively perform the optical to electrical transformation of the signal received from the fiber-optic communication channel 330. Similar to the transmitter 310, the receiver 360 includes a PMOS implemented VCO 364. In addition, the PMOS implemented VCO 364 is contained within a PLL 362 in certain embodiments. The FIG. 3 shows how a PMOS VCO may be implemented in either the transmitter 310 or the receiver 360 of the communication system 300.

Figure 4:
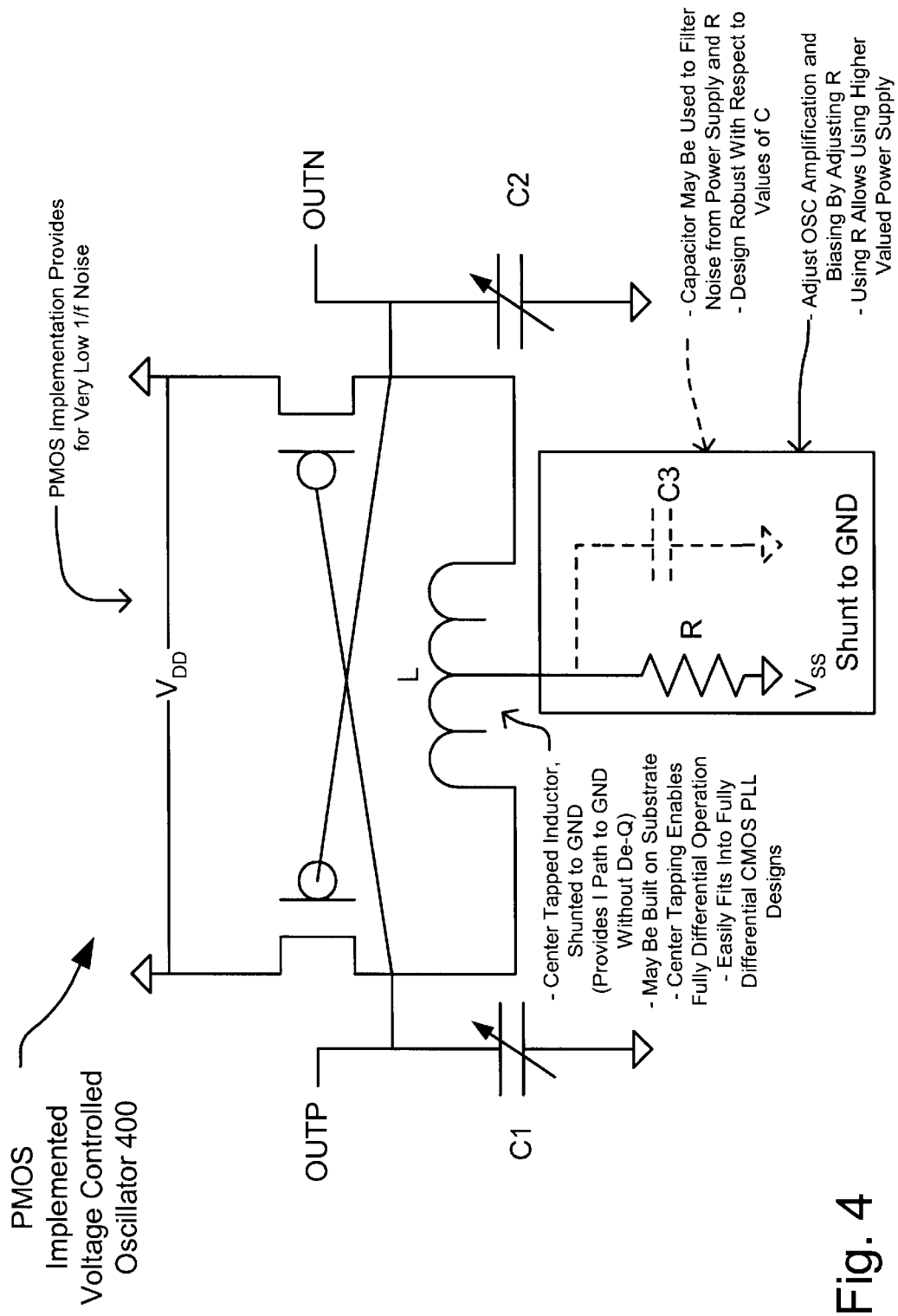
FIG. 4 is a system diagram illustrating an embodiment of a PMOS implemented VCO that is built in accordance with certain aspects of the present invention.

FIG. 4 is a system diagram illustrating an embodiment of a PMOS implemented voltage controlled oscillator (VCO) 400 that is built in accordance with certain aspects of the present invention. The PMOS implementation of the VCO provides for very low 1/f noise. PMOS transistors are connected to a center-tapped inductor L that is connected to ground; the ends of the center-tapped inductor L are communicatively coupled to the drains of the PMOS devices. The gates of the PMOS devices are cross-coupled to the opposite ends of the center-tapped inductor to which the drains of the respective PMOS devices are communicatively coupled. A resistor R connected to the center-tapped inductor L provides the DC current route. As described above, the PMOS devices may be over-driven to provide for a higher transconductance ($g_m$) thereby achieving higher gain than is commonly achievable in PMOS devices. However, there is a desire to ensure that the voltage drop across the nodes of the PMOS devices does not exceed a certain value, as those skilled in the art will appreciate that the PMOS reliability can decrease when the voltage across the nodes is above the rated voltage of the device.

For example, when the PMOS device is designed so that the voltage across any two nodes should not exceed 1.5 V, then the resistor R may be implemented to ensure that the voltage drop across the PMOS nodes is always below that threshold. This way, a higher voltage power supply may be used to over-drive the PMOS devices while simultaneously ensuring that the voltage drop across any two nodes does not exceed the threshold that may potentially lead to a reduction in the PMOS reliability. For example, in one embodiment, the voltage used for $V_{DD}$ (connected to the source of the PMOS devices) is approximately 1.8 V, and the value of the resistor R is chosen so that the voltage that is seen at the OUTP/N node does not go below 0.36 V. This way, the maximum voltage across any two of the PMOS device nodes does not exceed 1.44 V in an effort to avoid long-term stability problems. This way, a greater driving current is provided to the PMOS devices than is typically used, thereby realizing the higher transconductance ($g_m$) and providing for the higher gain.

In addition, a capacitor C3 may be used to filter noise from the power supply as well as any thermal Johnson noise that may be generated by resistor R. Because the capacitor C3 is connected to the AC ground, the value of the capacitance has no effect on the VCO oscillation frequency. The design of the PMOS VCO 400 is extremely robust with respect to the values of C3. Moreover, the VCO's oscillator biasing and thus oscillation amplitude can be adjusted by changing the value of R. Using a resistor R with proper value allows for the employment of a higher valued power supply that allows for the PMOS devices to be provided with an over-driven current.

The center-tapped inductor L may itself be fabricated on the substrate, one manner of which will also be shown below in another embodiment. The center-tapped inductor enables a fully differential operation of the present invention. Again, this differential operation allows for a relatively easy integration into fully differential CMOS (complementary metal oxide semiconductor) PLL designs and provides superior immunity to common mode noise.

Figure 5:
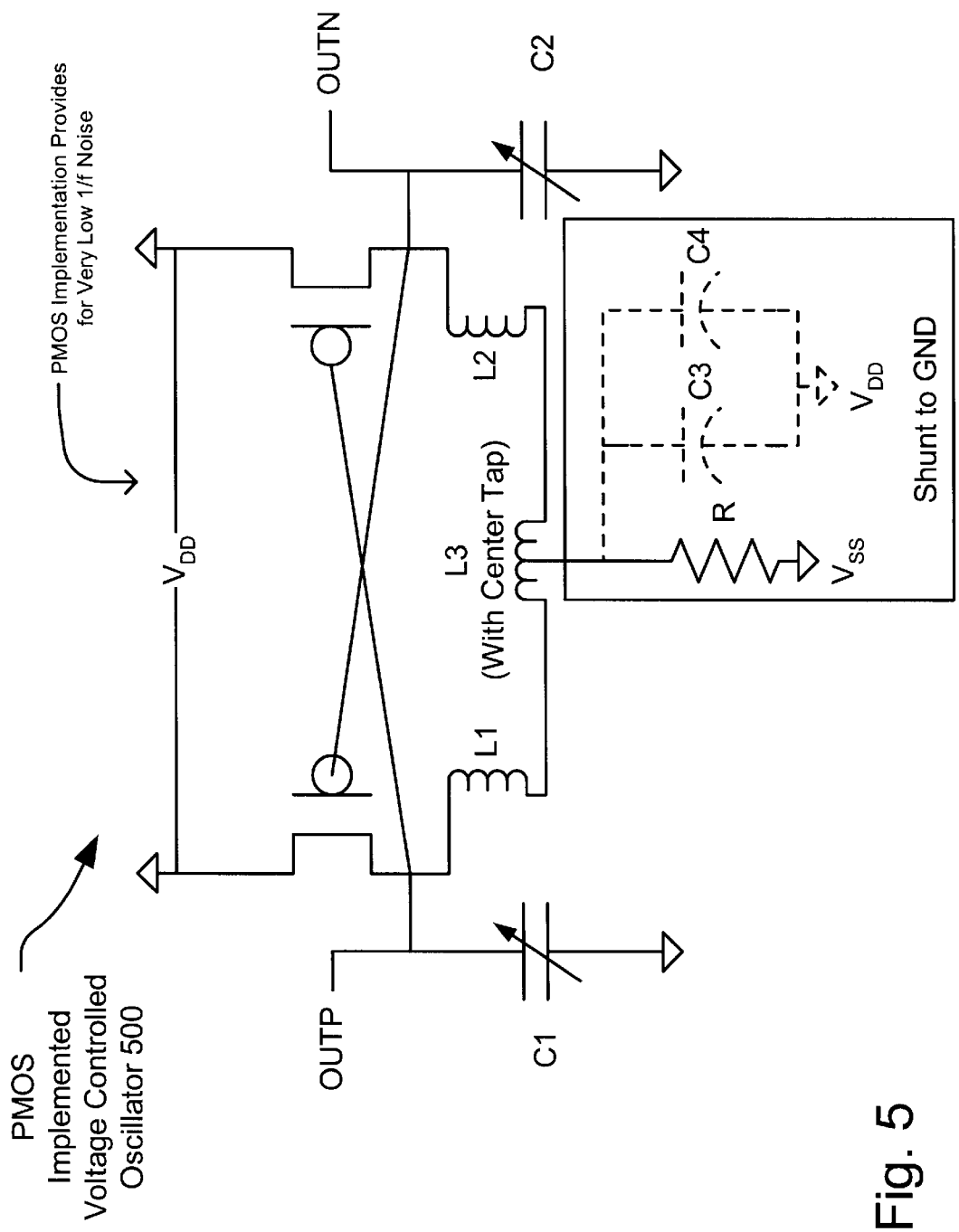
FIG 5 is a system diagram illustrating another embodiment of a PMOS implemented VCO that is built in accordance with certain aspects of the present invention.
Figure 6:
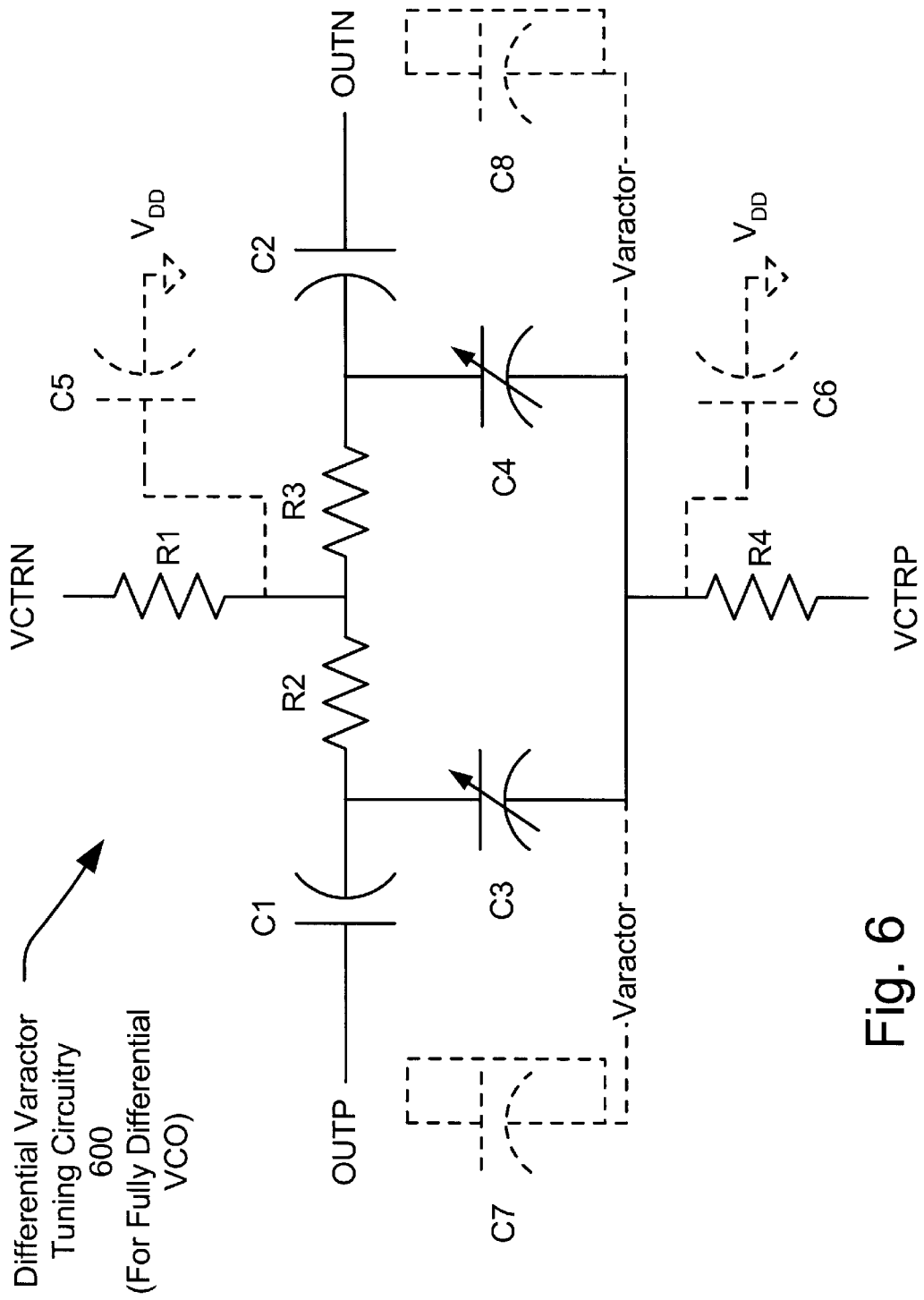
FIG. 6 is a system diagram illustrating an embodiment of a differential varactor tuning circuitry of the fully differential VCO, built in accordance with certain aspects of the present invention.

C1 and C2, in FIG. 5, are the varactors of the VCO whose capacitance varies with the tuning voltages of the loop, e.g., VCTRN and VCTRNP (the negative control voltage input and the positive control voltage input) in FIG. 6. As a result, the oscillation frequency of the VCO can be adjusted by changing the tuning voltage applied on the varactor. It is understood that the PMOS implemented VCO 400 is operable in a variety of applications including those employing a PLL. The PMOS implemented VCO 400 is amenable to provide a very clean frequency signal reference, at very high frequencies, if needed.

FIG. 5 is a system diagram illustrating another embodiment of a PMOS implemented VCO 500 that is built in accordance with certain aspects of the present invention. From certain perspectives, the PMOS implemented VCO 500 is very similar to the PMOS implemented VCO 400 within the FIG. 4. The PMOS implemented VCO 500 shows how a number of inductors, at least one of which is a center-tapped inductor, may be implemented to achieve similar operation as the PMOS implemented VCO 400. Other variations will be understood and appreciated by those persons having skill in the art. Here, a center-tapped inductor L3 is again shunted to the DC ground, $V_{SS}$. The shunt capacitors C3 and C4 are used to communicatively couple the center-tapped inductor L3 to the voltage level supplied by a voltage supply $V_{DD}$. The capacitors C3 and C4 may be implemented using different structures to achieve different values. For instance, one can be implemented by MOS-type capacitors and the other can be constructed by metal figure capacitors that have a lower capacitance per unit area but has a much higher Q-factor. Several capacitors with different values and Q-factors help to filter noise at different frequencies. The use of the inductors L1 and L2 may be employed when a center-tapped inductor cannot be found. Two inductors of identical inductance may be employed to functionally operate just as a center-tapped inductor.

Also similar to the embodiment shown in the FIG. 4, a higher than typical voltage may be employed for $V_{DD}$, thereby providing a greater driving current than is typically is provided through PMOS devices. This will help realize a higher transconductance ($g_m$) and provide for a higher gain.

The particular values for the various components may be appropriately chosen as required for the given application. It is understood that variations to the embodiment shown in the FIG. 5 may be effectuated without departing from the scope and spirit of the invention.

FIG. 6 is a system diagram illustrating an embodiment of a differential varactor tuning circuitry 600 of the fully differential VCO, built in accordance with certain aspects of the present invention. Two voltage control nodes, VCTRN and VCTRNP are used to bias and tune the varactor C3 and C4, which are AC coupled to the two leads of the inductor (OUTP and OUTN) through capacitor C1 and C2. C5 and C6 can be added to filter the noise in the control lines VCTRN and VCTRP, respectively. The PMOS implemented VCO may be the PMOS implemented VCO 400 of the FIG. 4 or the PMOS implemented VCO 500 of the FIG. 5.

The particular values for the various components may be appropriately chosen as required for the given application. It is understood that variations to the embodiment shown in the FIG. 6 may be effectuated without departing from the scope and spirit of the invention.

Figure 7:
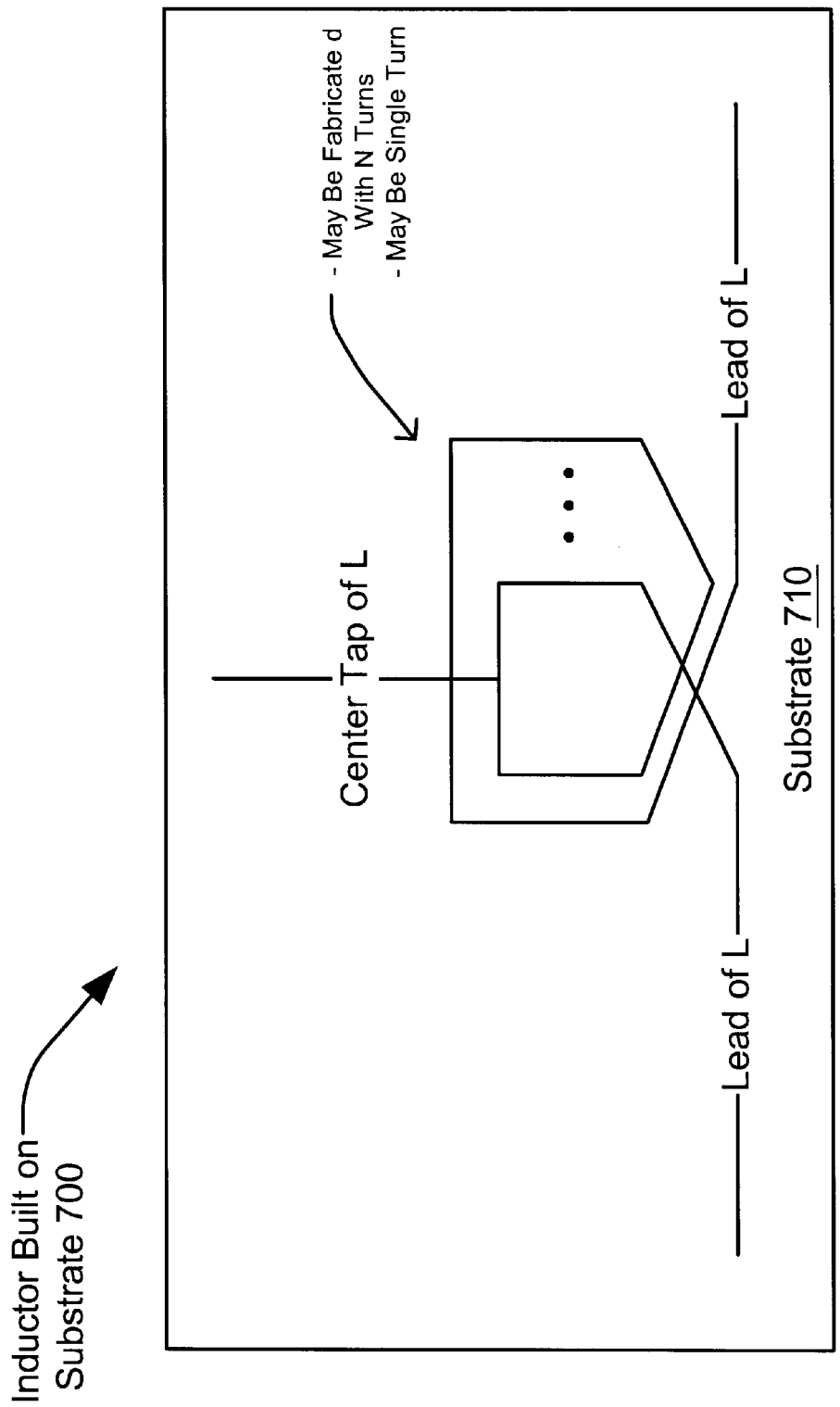
FIG. 7 is a system diagram illustrating an embodiment of an inductor built on a substrate in accordance with certain aspects of the present invention.

FIG. 7 is a system diagram illustrating an embodiment of an inductor 700 built on a substrate 710 in accordance with certain aspects of the present invention. The inductor 700 can be fabricated by one or several layer of metals which are connected in series or in parallel. A center tap of the inductor 700 is shunted to ground, as disclosed in other embodiments of the present invention. There may be single or multiple turns of the inductor 700 without departing from the scope and spirit of the invention. The leads of the inductor 700 are communicatively coupled to the appropriate portions within a PMOS fully differential VCO that is built in accordance with certain aspects of the present invention. It is noted that the center tap of L is connected to the center of the inner turn of the inductor.

Figure 8:
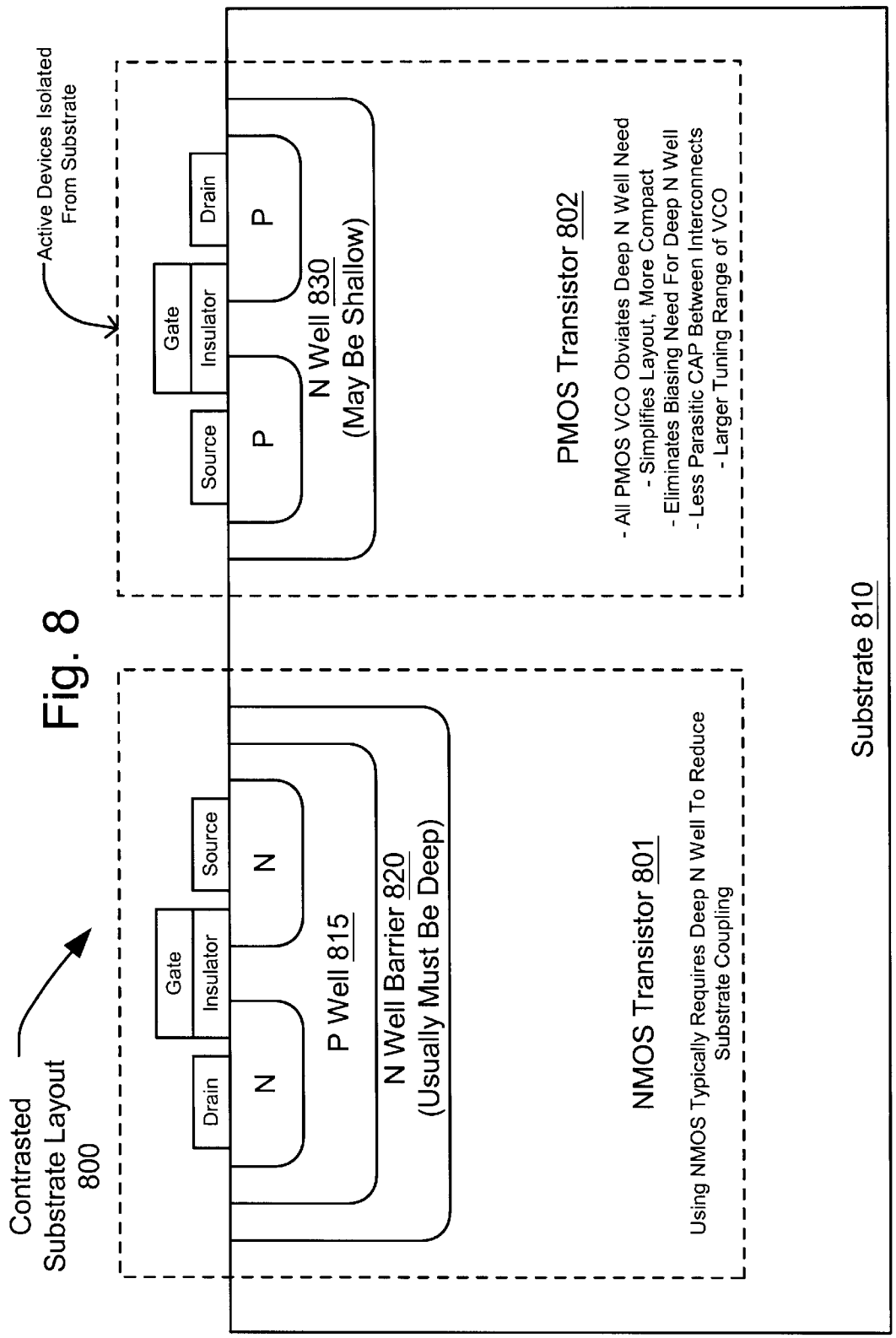
FIG. 8 is a system diagram illustrating an embodiment of contrasted cross section between a PMOS transistor that is built in accordance with certain aspects of the present invention versus an NMOS transistor in deep N WELL.

FIG. 8 is a system diagram illustrating an embodiment of contrasted cross section 800 between a PMOS transistor 802 that is built in accordance with certain aspects of the present invention versus an NMOS transistor in deep N WELL 801; both the NMOS transistor 801 and the PMOS transistor 802 are shown on a substrate 810. The left hand side of the FIG. 8 shows the NMOS transistor 801, and the right hand side of the FIG. 8 shows the PMOS transistor 802. The PMOS transistor 802 is used to fabricate a PMOS fully differential VCO that is built in accordance with certain aspects of the present invention.

The NMOS transistor 801 typically requires a deep NWELL 820 to reduce substrate coupling. In contrast, the active devices within the PMOS transistor 802 may be fabricated on an N WELL 830 that may be relatively shallow compared to the NWELL barrier 820 that is used in the NMOS transistor 801.

The implementation of a VCO using all PMOS devices obviates the need for the deep N WELL barrier to reduce substrate coupling. This enables for a more simplified layout (in the PMOS transistor 802) that is much more compact than the NMOS transistor 801. In addition, the more compact design ensures a less antennae-like functionality in terms of extraneous noise pickup; there is less parasitic capacitance between the VCO's interconnects given the more compact design. Moreover, many of these advantages of implementing the VCO using all PMOS transistors enables a larger tuning range of the VCO than if it were implemented using a combination of both NMOS and PMOS transistors.

Figure 9:
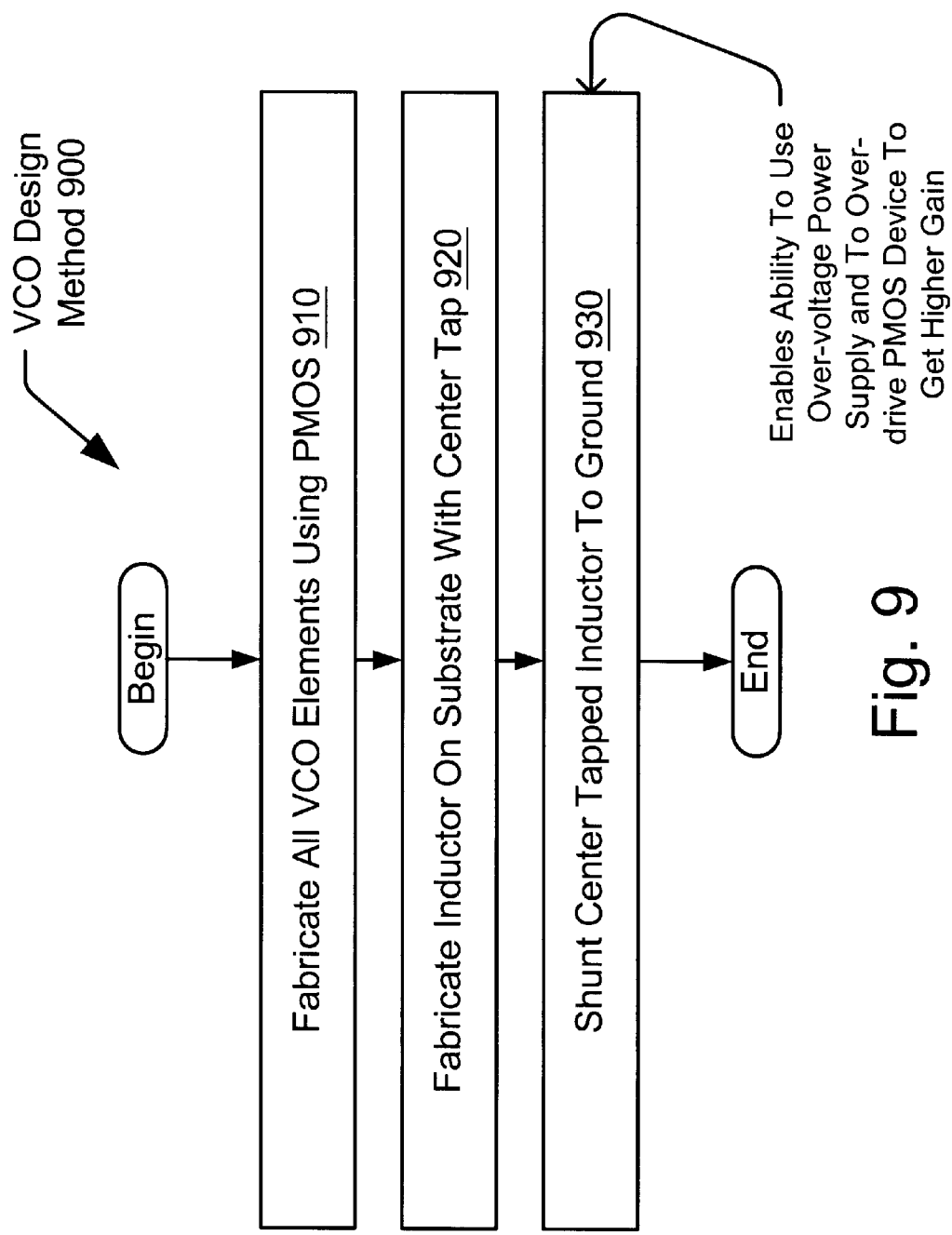
FIG. 9 is a functional block diagram illustrating an embodiment of a VCO design method that is performed in accordance with certain aspects of the present invention.

FIG. 9 is a functional block diagram illustrating an embodiment of a VCO design method 900 that is performed in accordance with certain aspects of the present invention. In a block 910, all transistors in a VCO are fabricated using PMOS technology. Then, in a block 920, an inductor is fabricated by metals on the substrate as well. If desired, the inductor is a center-tapped inductor. Alternatively, the multiple inductors may be employed, each having substantially identical inductance to effectuate the functionality of a center-tapped inductor. Then, in a block 930, the center-tapped inductor (or the inductance mid-point of a multiple inductor implementation) is shunted to ground.

Those persons having skill in the art will recognize that certain of the particular order of operations within the VCO design method 900 may be re-ordered without departing from the scope and spirit of the invention. For example, the operations within the block 920 may very well be performed before the operations within the block 910.

In view of the above detailed description of the invention and associated drawings, other modifications and variations will now become apparent to those skilled in the art. It should also be apparent that such other modifications and variations may be effected without departing from the spirit and scope of the invention.

What is claimed is:

1. A fully differential PMOS voltage controlled oscillator, comprising:
    a pair of PMOS transistors, each having a drain, a gate and a source;
    a center-tapped inductor;
    each of the drains of the PMOS transistors is communicatively coupled to an end of a center-tapped inductor;
    each of the sources of the PMOS transistors is communicatively coupled to a power supply; and
    each of the gates of the PMOS transistors is communicatively coupled to the drain of the other of the PMOS transistors.

2. The fully differential PMOS voltage controlled oscillator of claim 1, further comprising a capacitor that communicatively couples between the center tap of the center-tapped inductor and the power supply.

3. The fully differential PMOS voltage controlled oscillator of claim 1, further comprising a resistor that communicatively couples between the center tap of the center-tapped inductor and a DC ground voltage potential.

4. The fully differential PMOS voltage controlled oscillator of claim 3, wherein each PMOS transistor of the pair of PMOS transistors is operable up to a maximum voltage;
    the power supply is operable to provide a voltage larger than the maximum voltage; and
    a voltage supplied by the power supply is divided across the resistor and at least one of the PMOS transistors such that a voltage drop across any two terminals of the at least one of the PMOS transistors is less than the maximum voltage.

5. The fully differential PMOS voltage controlled oscillator of claim 1, wherein each PMOS transistor of the pair of PMOS transistors is over-driven with a current that generates a transconductance that exceeds a rated transconductance of each PMOS transistor of the pair of PMOS transistors.

6. The fully differential PMOS voltage controlled oscillator of claim 1, wherein the fully differential PMOS voltage controlled oscillator is contained within a phase locked loop.

7. The fully differential PMOS voltage controlled oscillator of claim 6, wherein the phase locked loop is contained within at least one of a transmitter and a receiver.

8. The fully differential PMOS voltage controlled oscillator of claim 6, wherein the at least one of a transmitter and a receiver is contained within a communication system.

9. The fully differential PMOS voltage controlled oscillator of claim 1, wherein the fully differential PMOS voltage controlled oscillator is contained within a fully differential CMOS phase locked loop.

10. The fully differential PMOS voltage controlled oscillator of claim 1, wherein the center-tapped inductor is fabricated on a surface of a substrate using metal.

11. The fully differential PMOS voltage controlled oscillator of claim 1, further comprising a differential varactor tuning circuitry, the differential varactor tuning circuitry comprising a positive control voltage input, a negative control voltage input, a positive control voltage output, and a negative control voltage output;
    the positive voltage output being communicatively coupled to a drain of one of the PMOS transistors; and
    the negative voltage output being communicatively coupled to a drain of the other of the PMOS transistors.

12. A phase locked loop, comprising:
    a phase detector that detects a phase difference between an incoming signal and an internal signal;
    a low pass filter, differentially communicatively coupled to the phase detector;
    a PMOS voltage controlled oscillator that is communicatively coupled to the low pass filter;
    a divider, differentially communicatively coupled to the PMOS voltage controlled oscillator, that provides a feedback signal to the phase detector; and
    a power supply that is communicatively coupled to the phase detector, the PMOS voltage controlled oscillator, and the divider.

13. The phase locked loop of claim 12, wherein the PMOS voltage controlled oscillator comprises a center-tapped inductor.

14. The phase locked loop of claim 13, wherein the PMOS voltage controlled oscillator comprises at least two PMOS transistors, each PMOS transistor of the at least two PMOS transistors comprises a drain, a gate and a source;
    each of the drains of the PMOS transistors is communicatively coupled to an end of a center-tapped inductor;
    each of the sources of the PMOS transistors is communicatively coupled to the power supply; and
    each of the gates of the PMOS transistors is communicatively coupled to the drain of the other PMOS transistor.

15. The phase locked loop of claim 13, further comprising a capacitor that communicatively couples between the center tap of the center-tapped inductor and the power supply.

16. The phase locked loop of claim 13, further comprising a resistor that communicatively couples between the center tap of the center-tapped inductor and a DC ground voltage potential.

17. The phase locked loop of claim 16, wherein each PMOS transistor of the pair of PMOS transistors is operable up to a maximum voltage;
    the power supply is operable to provide a voltage larger than the maximum voltage; and
    a voltage supplied by the power supply is divided across the resistor and at least one of the PMOS transistors such that a voltage drop across any two terminals of the at least one of the PMOS transistors is less than the maximum voltage.

18. The phase locked loop of claim 13, wherein each PMOS transistor is over-driven with a current that generates a transconductance that exceeds a rated transconductance of each PMOS transistor of the pair of PMOS transistors.

19. The phase locked loop of claim 13, wherein the center-tapped inductor is fabricated on a surface of a substrate using metal.

20. The phase locked loop of claim 12, wherein the phase locked loop is contained within at least one of a transmitter and a receiver.

21. The phase locked loop of claim 12, wherein the phase locked loop comprises a fully differential CMOS phase locked loop.

22. A communication system, comprising:
    a transmitter;
    a receiver; and
    a communication channel that communicatively couples the transmitter and the receiver; and
    wherein at least one of the transmitter and the receiver comprises a phase locked loop; and the phase locked loop comprises a fully differential PMOS voltage controlled oscillator.

23. The communication system of claim 22, wherein the fully differential PMOS voltage controlled oscillator comprises a center-tapped inductor.

24. The communication system of claim 23, wherein the phase locked loop further comprises a phase detector that detects the phase of an incoming signal;
 a low pass filter, differentially communicatively coupled to the phase detector;
 a divider, differentially communicatively coupled to the fully differential PMOS voltage controlled oscillator, that provides a feedback signal to the phase detector;
 a power supply that is communicatively coupled to the phase detector, the divider, and the fully differential PMOS voltage controlled oscillator; and
 the fully differential PMOS voltage controlled oscillator is differentially communicatively coupled to the phase detector.

25. The communication system of claim 23, wherein the fully differential PMOS voltage controlled oscillator comprises two PMOS transistors, each PMOS transistor comprises a drain, a gate and a source;
 each of the drains of the PMOS transistors is communicatively coupled to an end of a center-tapped inductor;
 each of the sources of the PMOS transistors is communicatively coupled to a power supply; and
 each of the gates of the PMOS transistors is communicatively coupled to the drain of the other PMOS transistor.

26. The communication system of claim 23, further comprising a capacitor that communicatively couples between the center tap of the center-tapped inductor and a power supply; and
 a resistor that communicatively couples between the center tap of the center-tapped inductor and a DC ground voltage potential.

27. The communication system of claim 23, wherein the center-tapped inductor is fabricated on a surface of a substrate using metal.

28. The communication system of claim 22, wherein the fully differential PMOS voltage controlled oscillator comprises two PMOS transistors;
 each PMOS transistor is operable up to a maximum voltage;
 a power supply is operable to provide a voltage larger than the maximum voltage; and
 a voltage supplied by the power supply is divided across the resistor and at least one of the PMOS transistors such that a voltage spanning at least two terminals of at least one of the PMOS transistors is less than the maximum voltage.

29. The communication system of claim 22, wherein the fully differential PMOS voltage controlled oscillator comprises at least two PMOS transistors; and
 each PMOS transistor is over-driven with a current that generates a transconductance that exceeds a rated transconductance of each PMOS transistor of the pair of PMOS transistors.

30. The communication system of claim 22, wherein the communication channel comprises at least one of a wireline communication channel, a wireless communication channel and a fiber-optic communication channel.

* * * * *